United States Patent [19]

Sparks et al.

[11] Patent Number: 5,199,032
[45] Date of Patent: Mar. 30, 1993

[54] MICROCONTROLLER HAVING AN EPROM WITH A LOW VOLTAGE PROGRAM INHIBIT CIRCUIT

[75] Inventors: Robert W. Sparks, Tokyo, Japan; Gregory A. Racino; Brian R. Gardner, both of Austin, Tex.

[73] Assignee: Motorola, Inc., Schaumburg, Ill.

[21] Appl. No.: 576,864

[22] Filed: Sep. 4, 1990

[51] Int. Cl.⁵ .................................... G06F 11/30
[52] U.S. Cl. .................................... 371/3; 371/4; 371/66; 395/575; 364/707; 364/DIG. 1
[58] Field of Search ... 364/200 MS File, 900 MS File, 364/707; 395/400 MS File, 425 MS File, 575 MS File; 371/3, 4, 14, 66; 307/64, 66

[56] References Cited

U.S. PATENT DOCUMENTS

| | | | |
|---|---|---|---|
| 4,644,494 | 2/1987 | Muller | 395/425 |
| 4,780,843 | 10/1988 | Tietjen | 395/725 |
| 4,977,537 | 12/1990 | Dias et al. | 395/750 |
| 5,014,191 | 5/1991 | Padgaonkar et al. | 395/425 |
| 5,040,178 | 8/1991 | Lindsay et al. | 371/21.5 |

Primary Examiner—Joseph L. Dixon
Assistant Examiner—Reba I. Elmore
Attorney, Agent, or Firm—Charlotte B. Whitaker

[57] ABSTRACT

A microcontroller is provided having an on-chip electrically erasable programmable read-only-memory (EEPROM), which is user programmable via a programming register. The microcontroller includes a low voltage program inhibit (LVPI) circuit which is combined with the existing EEPROM design. By integrating the LVPI circuit into the EEPROM, the EEPROM may be protected without disabling the entire data processing system. If the supply voltage ($V_{DD}$) falls below a predetermined voltage level, the LVPI circuit inhibits the use of the EEPROM programming register, thereby preventing the CPU from programming or erasing the EEPROM. A comparator in the LVPI circuit compares a precision reference voltage to a voltage divided off of the power supply ($V_{DD}$), and provides a output signal to the EEPROM programming register. During normal operation, the comparator output signal is a logic low, which enables the user to program or erase the EEPROM, via the programming register. When the supply voltage is below the predetermined safe level, the comparator output signal is a logic high signal, which sets a control bit in the programming register. When set, the control bit clears the remaining bits in the programming register, thereby disabling a charge pump, and preventing any further EEPROM programming.

10 Claims, 4 Drawing Sheets

MICROCONTROLLER HAVING AN EPROM WITH A LOW VOLTAGE PROGRAM INHIBIT CIRCUIT

FIELD OF THE INVENTION

This invention relates generally to data processors, and more particularly, to a mechanism for protecting an EEPROM from supply voltage changes.

BACKGROUND OF THE INVENTION

Today's microcontrollers (MCUs) incorporate on-chip non-volatile electrically erasable programmable read-only memory (EEPROM) to provide the programmer with even greater flexibility in developing applications programs. These MCUs allow the programmer to write a program into the EEPROM and, if desired, later electrically erase and revise the program. Accordingly, MCUs having self-programming capabilities may alter (program or erase) the contents of the EEPROM during the normal course of CPU operation. If the supply voltage ($V_{DD}$) falls below specification levels, while the MCU is still in the operational mode, faulty data may be written into the EEPROM, or locations in the EEPROM may be improperly erased. Consequently, the data integrity of the EEPROM may be compromised when the supply voltage falls below the specification level.

Known MCUs employ various measures to alleviate this problem. For example, the Motorola MC6805P2 MCU uses an Low Voltage Inhibit (LVI) circuit to reset the entire system when the voltage falls below a specified level. This approach requires; however, that the CPU stop all program execution while the entire system is reset. Alternatively, MCUs such as the Motorola MC68HC05A6 use external stimulus for programming the on-chip EEPROM. Accordingly, an external pin is required to provide the EEPROM with the program control signal. Thus, it is desirable to provide an EEPROM protection scheme capable of overcoming the foregoing problems.

SUMMARY OF THE INVENTION

A microcontroller is provided having an on-chip electrically erasable programmable read-only-memory (EEPROM), which is user programmable via a programming register. The microcontroller includes a low voltage program inhibit (LVPI) circuit which is combined with a conventional EEPROM. By integrating the LVPI circuit into the EEPROM, the EEPROM may be protected without disabling the entire data processing system. If the supply voltage ($V_{DD}$) falls below a predetermined voltage level, the LVPI circuit inhibits the use of the EEPROM programming register, thereby preventing the CPU from programming or erasing the EEPROM. A comparator in the LVPI circuit compares a precision reference voltage to a voltage divided off of the power supply ($V_{DD}$), and provides a output signal to the EEPROM programming register. During normal operation, the comparator output signal is a logic low, which enables the user to program or erase the EEPROM, via the programming register. When the supply voltage is below the predetermined safe level, the comparator output signal is a logic high signal, which sets a control bit in the programming register. When set, the control bit clears the remaining bits in the programming register, thereby disabling a charge pump, and preventing any further EEPROM programming.

DETAIL DESCRIPTION OF THE INVENTION

The terms "set" and "clear", and various grammatical forms thereof, are used herein to avoid confusion when dealing with a mixture of "active high", and "active low" logic signals. "Set" is used to the rendering of a logic signal or register bit into its active state, or logically true state. "Clear" is used to refer to the rendering of a logic signal or register bit into its inactive, or logically false state.

Figure 1:
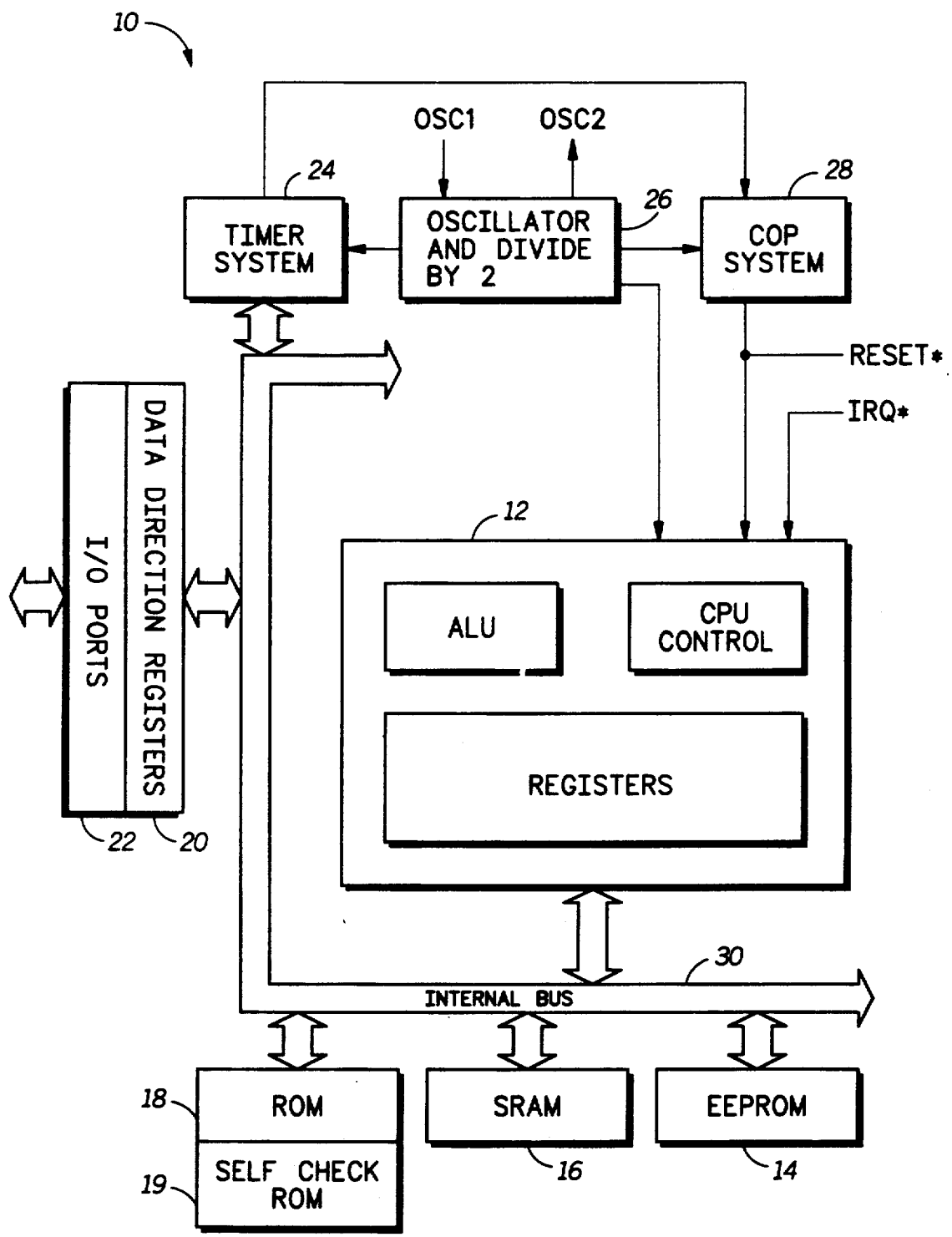
FIG. 1 is a block diagram illustrating a preferred embodiment of a data processing system of the present invention.

Illustrated in FIG. 1 is a detailed block diagram of a data processing system 10 employing an interrupt service system in accordance with the present invention. In the preferred embodiment, data processing system 10 is a microcontroller with sophisticated, on-chip peripheral capabilities. Data processing system 10 comprises a core central processing unit (CPU) 12, electrically erasable programmable read-only memory (EEPROM) 14, a static random access memory (SRAM) 16, read-only memory (ROM) 18, data direction registers 20, which are individually coupled to input/output ports 22. In the preferred embodiment, ports 22 are 8-bit bidirectional ports comprising eight I/O lines. The state of any I/O line is software programmable, and all port I/O lines are configured as inputs during power-on reset. Data processing system 10 further comprises a timer system 24, a crystal oscillator with divide by two (2) logic circuitry 26, a computer operating properly (COP) watchdog system 28, and an internal communications bus 30. In the preferred embodiment, the internal communications bus 30 includes all of the requisite control signals (e.g. R/W*) for providing address or data to and from the various on-chip peripherals. Data processing system 10 contains a COP system 28 which will automatically time-out the data processing system 10, if it is not reset (cleared) within a specific time by the program reset sequence.

Figure 2:
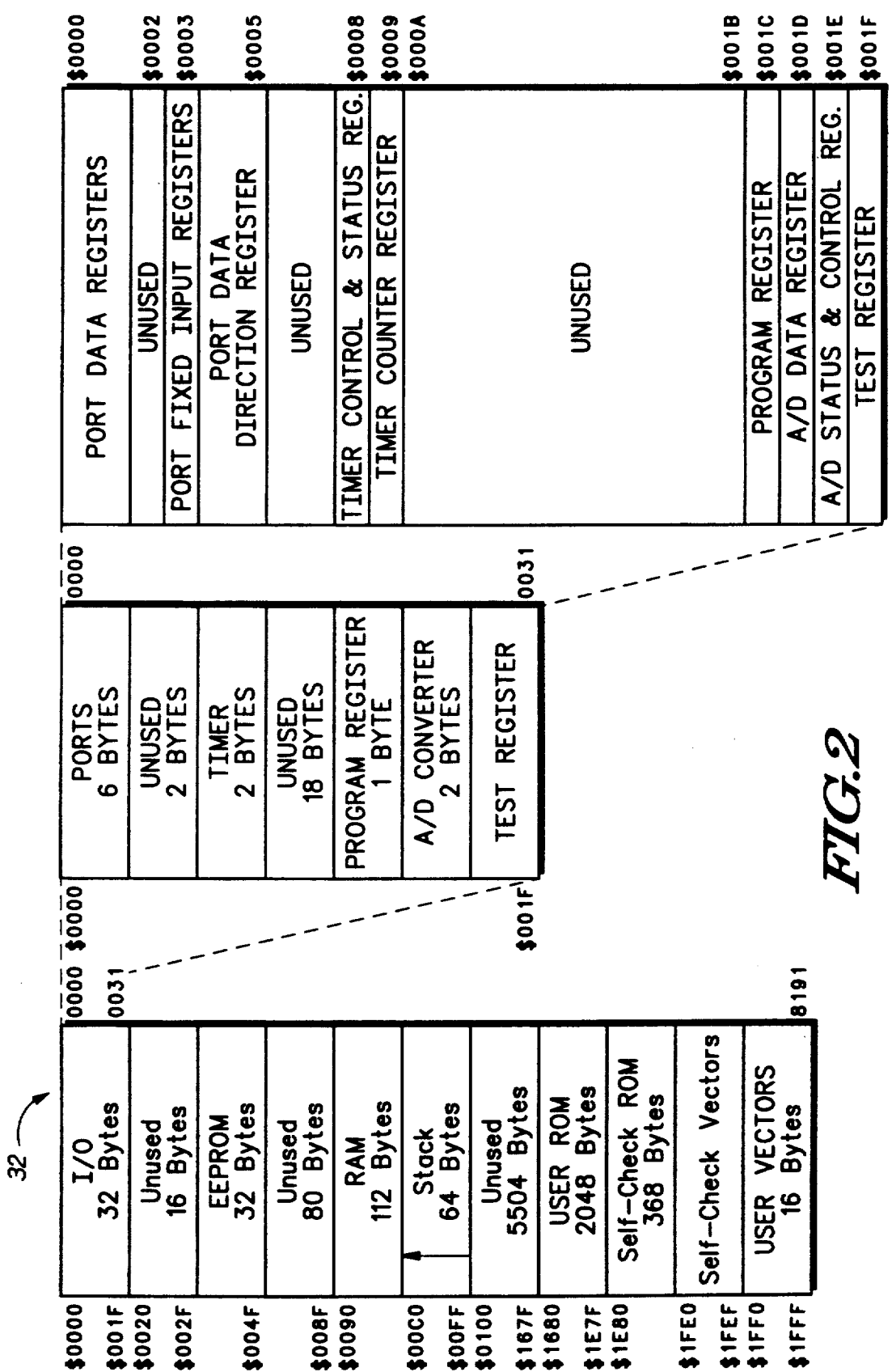
FIG. 2 is a diagram illustrating a memory map for the data processing system of FIG. 1.

Illustrated in FIG. 2 is the memory map 32 for data processing system 10. In the preferred embodiment, data processing system 10 has an 8K byte memory map for the user ROM 18, self-check ROM 19, user RAM 16, EEPROM 14, and I/O (e.g. ports 22, timer 24). The 2048 bytes of user ROM 18 are located from hexadecimal address $1680 to $1E7F, with sixteen (16) bytes of user vectors from address $1FF0 to $1FFF. The Self-Check ROM 19 and vectors are located from $1E80 to $1FEF. The user RAM consists of 112 bytes of a shared stack area, with the stack beginning at address $00FF. The stack pointer can access sixty-four (64) bytes of RAM 16 in the address range $00FF to $00C0. In the preferred embodiment, the on-chip EEPROM 14 is thirty-two (32) bytes long, and is located from address $0030 to $004F. The user may program the EEPROM 14 on a single-byte basis by manipulating the Programming Register 64 (FIG. 4), located at address $001C.

Figure 3:
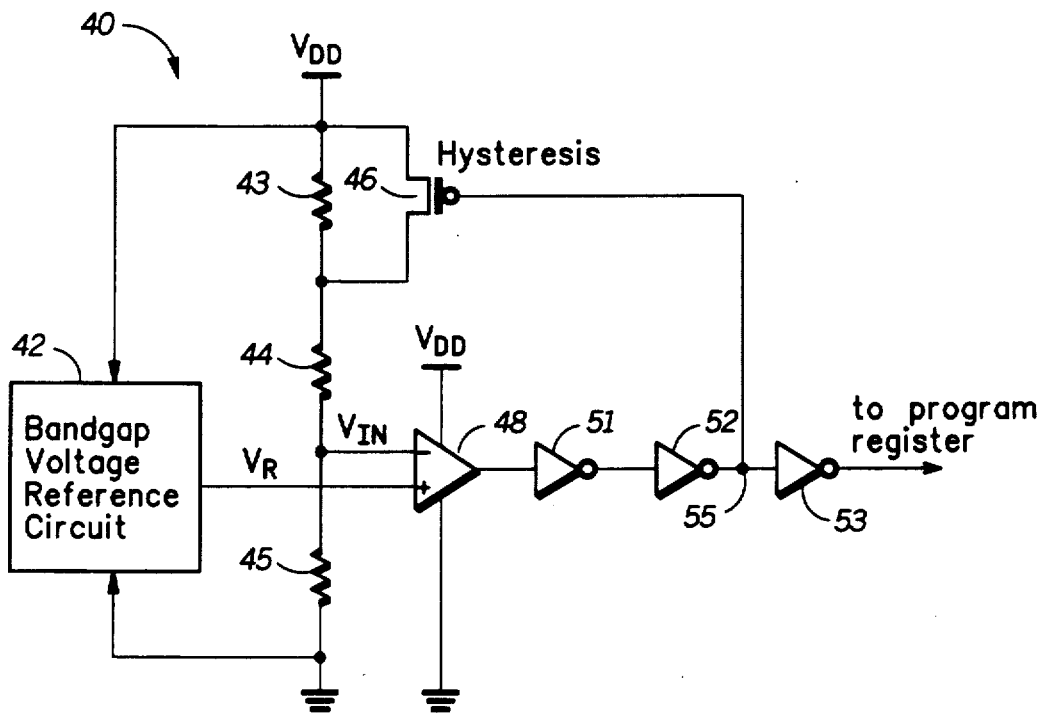
FIG. 3 is a partial schematic diagram of a low voltage program inhibit (LVPI) circuit in accordance with the present invention.

In the present invention, low-voltage programming inhibit (LVPI) circuitry 40 inhibits the use of the programming register 64 when the supply voltage ($V_{DD}$) falls below a specified voltage ($V_{LVPI}$). Shown in FIG. 3 is a partial schematic diagram of a LVPI circuit 40, in accordance with the present invention. In the preferred embodiment of the present invention, the LVPI circuit 40 comprises a bandgap voltage reference (BVR) circuit 42, resistors 43–45, a P-channel transistor 46, a comparator 48, and inverters 51-53. The BVR circuit 42 has a first input connected to a positive supply voltage ($V_{DD}$), and a second input connected to a negative power supply voltage (shown as ground). Similarly, the comparator 48 has a first control input connected to $V_{DD}$, and a second control input connected to ground. In a preferred embodiment of the present invention, the proportional resistance (R) of resistors 43–45 are 0.4R, 4.4R, and 2.1R units, respectively.

In operation, the comparator 48 compares a precision reference voltage ($V_R$), provided by the BVR circuit 42, to a voltage divided off of the supply voltage ($V_{DD}$). During normal operation ($V_{DD} \approx 5$ V), the comparator 48 outputs a logic "0" (logic low voltage). The logic "0" is inverted by inverter 51, and re-inverted to its original polarity by inverter 52, to provide a logic low voltage at node 55. Since the voltage at node 55 is a logic low voltage, transistor 46 becomes conductive. In the preferred embodiment of the present invention, inverters 51 and 52 provide additional gain to the comparator 48 operation. Transistor 46 provides a hysteresis mechanism, whereby when the supply voltage $V_{DD}$ remains above the specified voltage $V_{LVPI}$, the input voltage $V_{IN}$ is larger in magnitude than the reference voltage $V_R$. Since the comparator 48 outputs a logic low voltage, node 55 is at a logic low voltage, thereby causing transistor 46 to remain conductive. Conversely, when the supply voltage $V_{DD}$ falls below the specified voltage $V_{LVPIF}$ (e.g. 3.9 V), the input voltage $V_{IN}$ is smaller in magnitude than the reference voltage $V_R$. Consequently, the comparator 48 outputs a logic high signal, thereby causing node 55 to be at a logic high voltage. The logic high voltage at node 55 causes transistor 46 to become non-conductive, and drives the $V_{IN}$ to the comparator 48 even lower. When the supply voltage $V_{DD}$ rises above a second specified voltage $V_{LVPIR}$ (e.g. 4.1 V) the output of comparator 48 changes back to a logic low signal. Shown in Table I, for illustrative purposes only, are the equations for $V_{IN}$ when transistor 46 is conductive, versus when transistor 46 is non-conductive.

TABLE I $$V_{IN} = \frac{2.1R}{2.1R + 4.4R} V_{DD}; \text{ with transistor on}$$

$$V_{IN} = \frac{2.1R}{2.1R + 4.8R} V_{DD}; \text{ with transistor off}$$

Figure 4:
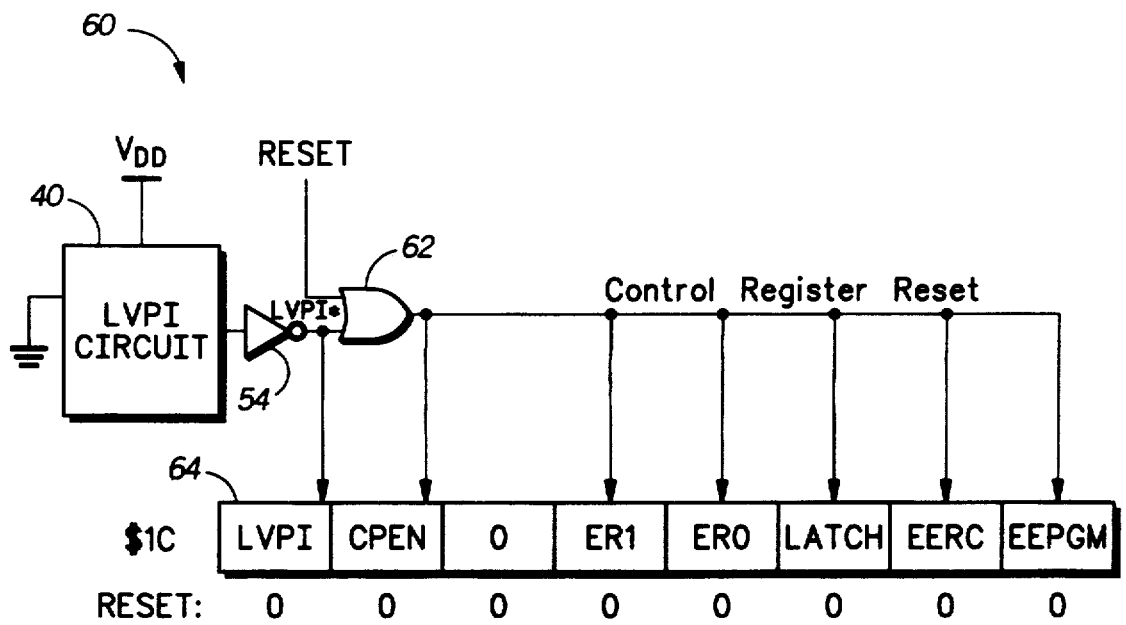
FIG. 4 is a diagram of a protection scheme within an electrically erasable programmable read only memory (EEPROM) using the LVPI circuit of FIG. 3.

The LVPI circuit 40 inhibits or enables the use of the programming register 64, via an output control signal (LVPI*). Shown in FIG. 4 are the bit encoding of the programming register 64. In the present invention, the programming register 64 is an 8-bit register comprised generally of six (6) control bits (EEPGM[0]; EERC[1]; LATCH[2]; ER0[3]; ER1[4]; and CPEN[6]) for programming or erasing the EEPROM 14, and one (1) control bit (LVPI[7]) for inhibiting or enabling the use of the programming register 64. A functional description of the control bits is provided below.

In accordance with a preferred embodiment of the present invention, the control bits [0:6] of programming register 64 are reset (cleared) whenever an internal RESET signal is a logic high, or alternatively, when the LVPI* signal is a logic high. OR-gate 62 has a first input coupled to the output of inverter 54, for receiving the LVPI* signal, a second input for receiving an internal RESET signal, and an output coupled to the programming register 64, for providing a Control Register Reset signal. During normal operation, the LVPI circuit 40 outputs a logic high LVPI signal, which is inverted by inverter 54 to provide a logic low signal (LVPI*). Since the LVPI* signal is a logic low, the control bit LVPI[7] of programming register 64 is not set. OR-gate 62 receives the logic low LVPI* signal, and the logic low RESET signal (assuming no system reset occurred), and provides a logic low RESET signal to programming register 64. Consequently, the use of the programming register 64 is not inhibited. In contrast, when $V_{DD}$ falls below $V_{LVPI}$, the LVPI circuit 40 outputs a logic low LVPI signal, which is inverted by inverter 54 to provide a logic high LVPI* signal. Thus, the LVPI[7] bit is set, forcing the remaining control bits [0:6] in the programming register 64 to the reset condition. Accordingly, OR-gate 62 receives the logic high LVPI* signal, and the logic low RESET signal, and provides a logic high RESET signal to the programming register 64. The use of the programming register 64 is, therefore, inhibited, and the control bits [0:6] are cleared.

In the present invention, the LVPI[7] bit is automatically set and cleared by the LVPI circuit 40, and is not writable. As described earlier, when set, the LVPI[7] bit forces control bits [0:6] of the programming register 64 to a reset condition, thereby disabling the charge pump, and preventing EEPROM programming. Accordingly, the CPEN[6] cannot be set when the LVPI bit is set. During power-up, the LVPI[7] is set until $V_{DD}$ reaches $V_{LVPI}$, at which time the LVPI[7] bit is cleared. The Charge Pump Enable bit CPEN[6] is readable and writable, and is cleared by a reset. When set, the CPEN[6] enables a charge pump which produces the internal programming voltage. The required programming voltage is not available, however, until the EEPGM[0] is set. The charge pump is disabled when not in use.

The Erase Set bits ER0[3] AND ER1[4] are readable and writable, and cleared by reset. ER0[3] and ER1[4] form a two bit field which is used to select one of three erase modes: byte, block or bulk. Shown in Table II are the modes selected for each bit configuration. In the byte erase mode, only the selected byte in the EEPROM 14 is erased. The EEPROM 14 is divided into four eight (8) byte address blocks $0030-$0037; $0038-$003F; $0040-$0047; and $0048-$004F. In the block erase mode, an eight (8) byte block of the EEPROM 14 is erased. Thus, the performance of a block erase to any address within a block erases the entire block. In the bulk erase mode, the entire thirty-two (32) byte EEPROM 14 section is erased.

TABLE II

| ER1 | ER0 | MODE |
|---|---|---|
| 0 | 0 | No Erase |

TABLE II-continued

| ER1 | ER0 | MODE |
|---|---|---|
| 0 | 1 | Byte Erase |
| 1 | 0 | Block Erase |
| 1 | 1 | Bulk Erase |

The LATCH[2] bit is readable and writable, and cleared by a reset. LATCH[2] configures the address and data bus (not shown) for programming the EEPROM 14. Accordingly, when LATCH[2] is set, writes to the EEPROM 14 array cause the data bus and address bus to be latched. Reads from the array are inhibited if the LATCH[2] bit is set, and a write to the EEPROM 14 has taken place. When the LATCH[2] bit is clear, the address and data buses (not shown) are configured for normal operation.

The EEPROM RC Oscillator Control bit EERC[1] is readable and writable, and cleared by a reset. When the EERC[1] bit is set, the EEPROM 14 uses the internal RC oscillator, instead of the CPU CLOCK. A delay of a predetermined time period is required, after setting the EERC[1] bit, to allow the RC oscillator to start.

The EEPROM Programming Power Enable bit EEPGM[0] is readable at any time; however, writes to this bit may occur only if the LATCH[2] bit is set, and a write to the EEPROM 14 has taken place. If the LATCH[2] bit is not set, the EEPGM[0] cannot be set. When set, the EEPGM[0] enables the programming voltage for programming (or erasing) the EEPROM 14. When the EEPGM[0] is clear, the power is switched off. This feature allows the pulsing of the programming voltage to be controlled internally. Thus, during normal operation, when programming a byte of EEPROM 14, the LATCH[2] and CPEN[6] bits are set, and the ER1[4] and ER0[3] bits are cleared. The data is written to the desired address, and the EEPGM[0] bit is set for a predetermined time (e.g. 15 ms). When erasing a byte of EEPROM 14, the LATCH[2] and CPEN[6] and ER1[4] bits are set, and the ER0[3] bit is cleared. A write to the selected address is performed, and the EEPGM[0] bit is set for the predetermined time.

Figure 5:
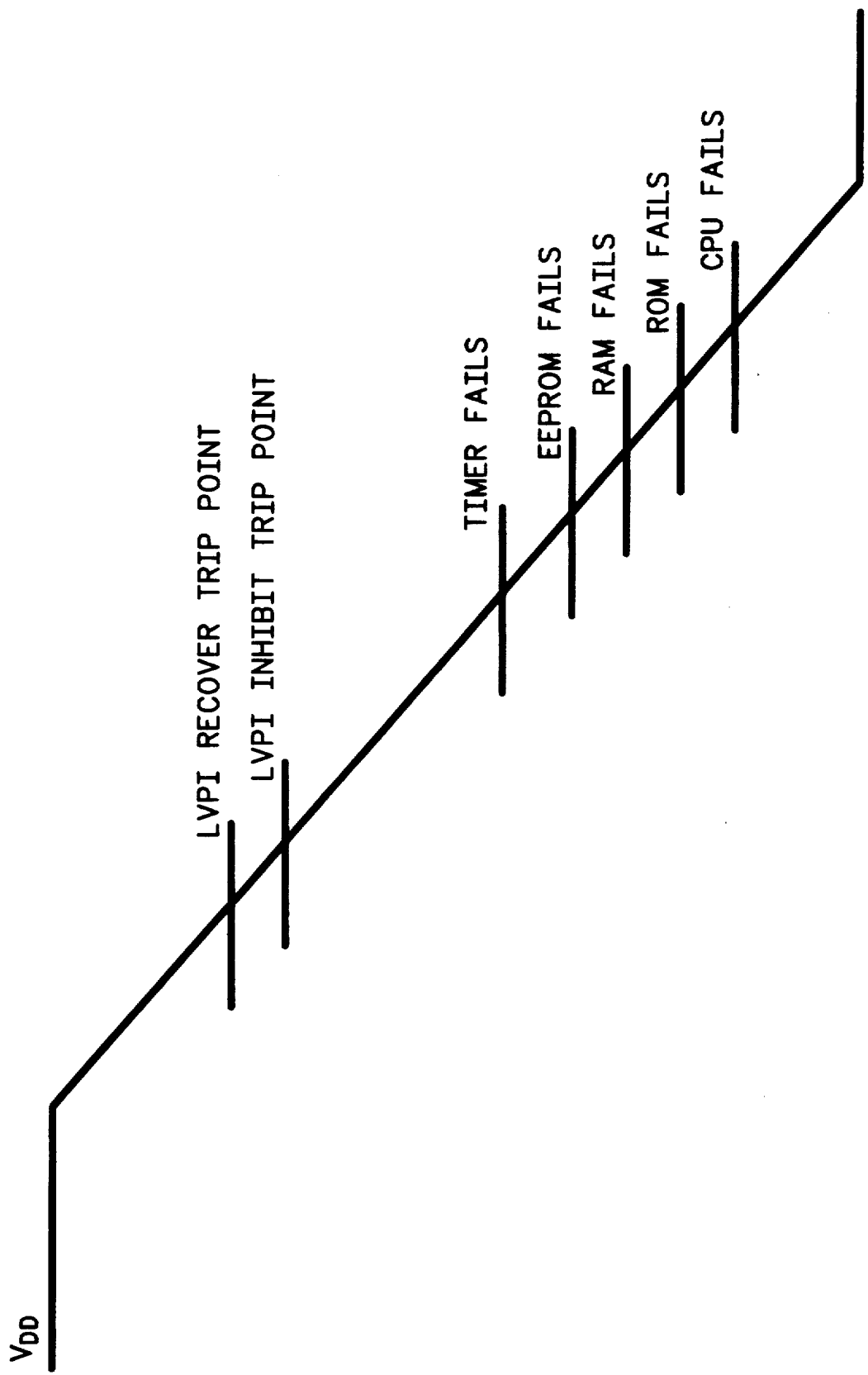
FIG. 5 is a diagram illustrating a typical on-chip peripheral failure sequence for the data processing system of FIG. 1.

FIG. 5 illustrates a typical on-chip peripheral failure sequence. In the present invention, as the supply voltage $V_{DD}$ falls below the level required for reliable operation (LVPI inhibit trip point), the LVPI circuit 40 will prevent (disable) the CPU 12 from programming or erasing the EEPROM 14. Essentially, the LVPI circuit 40 constantly monitors the supply voltage level ($V_{DD}$) of the data processing system 10. By integrating the LVPI circuit 40 into the EEPROM 14, the EEPROM 14 may be protected without disabling the entire data processing system 10. Accordingly, the LVPI circuit 40 may signal the CPU 12 that the supply voltage level is declining below the requisite level, and in so doing, initiate a controlled power down sequence. Conversely, during a power-up sequence, the LVPI circuit 40 may signal the CPU 12 when the voltage levels are sufficient for reliable operation. Moreover, the use of the present invention does not prevent the user from operating the remainder of the data processing system 10 (including EEPROM read) at a voltage below the LVPI trip point.

While the present invention has been described in a preferred embodiment, it will be apparent to those skilled in the art that the disclosed invention may be modified in numerous ways and may assume many embodiments other than that specifically set out and described above. For example, the proportional resistance (R) units disclosed herein may be changed in order to provide a larger or smaller LVPI inhibit trip point voltage. Furthermore, the memory map (FIG. 2) may be modified to accommodate more on-chip peripherals, or the relocate the address of the EEPROM 14. Moreover, the bit encodings of the programming register 64 may be altered to accommodate additional EEPROM programming options. Accordingly, it is intended by the appended claims to cover all modifications of the invention which fall within the true spirit and scope of the invention.

We claim:

1. In a data processing system having a processor, an electrically alterable memory, and a communications bus for communicating therebetween, protection means included in said memory for inhibiting the alteration of said memory when a supply voltage falls below a specified voltage level, said protection means comprising:
   first means for providing a reference voltage;
   second means coupled to said first means for comparing a second voltage generated from said supply voltage to said reference voltage, and for providing an output signal, said output signal having a first logic value when said second voltage is larger in magnitude than said reference voltage, and a second logic value when said second voltage is smaller in magnitude that said reference voltage;
   third means coupled to said second means for supplying said second voltage to said second means, said third means operating to insure that when said supply voltage remains above the specified voltage level, said second voltage supplied to said second means is larger in magnitude than said reference voltage, and when said supply voltage falls below the specified voltage level, said second voltage supplied to said second means is smaller in magnitude that said reference voltage; and
   fourth means coupled to said second means for storing a plurality of control bits for controlling programming of said memory, said fourth means inhibiting the alteration of said memory when said output signal is said second logic value, without disabling said processor from accessing information stored in said memory during performance by said processor of other data processing operations, and enabling the programming of said memory when said output signal is said first logic value, said fourth means controlling programming of said memory by manipulating said control bits based upon the logic value of said output signal.

2. The protection means of claim 1 wherein said first means comprises a voltage reference circuit.

3. The protection means of claim 2 wherein said output signal provided by said second means clears said control bits when said supply voltage falls below said specified voltage level, thereby inhibiting the programming of said memory.

4. The protection means of claim 3 wherein said fourth means comprises:
   register means for storing said plurality of control bits for programming and erasing a plurality of data bytes stored in said memory;
   ORing means coupled to said register means, said ORing means having a first input for receiving said output signal, a second input for receiving an internal reset signal provided by said processor, and an output for clearing said control bits stored in said register means, when said supply voltage falls below said specified voltage level.

5. The protection means of claim 4 wherein said fourth means resets said control bits in said register means, when said supply voltage falls below said specified voltage level.

6. In a data processing system having a processor, an electrically alterable memory, and a communications bus for communicating therebetween, protection means in said memory for inhibiting alteration of said memory when a supply voltage falls below a specified voltage level, said protection means comprising:

detection means for detecting when said supply voltage falls below said specified voltage level, and for providing an output control signal, in response thereto; and programming means, coupled to said detection means, for storing a plurality of control bits for controlling alteration of said memory, and for inhibiting manipulation of said control bits, said programming means preventing said processor from altering said memory, in response to said output signal having a first logic value, without disabling said processor from accessing information stored in said memory during performance by said processor of other data processing operations, said programming means comprising:

register means for storing said plurality of control bits for programming and erasing a plurality of data bytes stored in said memory;

logic means coupled to said register means, said logic means having a first input for receiving said output signal, a second input for receiving an internal reset signal provided by said processor, and an output for clearing said control bits stored in said register means, when said supply voltage falls below said specified voltage level.

7. The protection means of claim 6 wherein said detection means comprises:

first means for providing a reference voltage;

second means coupled to said first means for comparing a second voltage generated from said supply voltage to said reference voltage, and for providing an output signal indicating whether said second voltage is larger or smaller in magnitude than said reference voltage;

third means coupled to said second means for supplying said second voltage to said second means, said third means indicating when said supply voltage falls below said specified voltage level.

8. The protection means of claim 7 wherein said first means comprise a voltage reference circuit.

9. The protection means of claim 7 wherein said second means comprises a voltage comparator.

10. The protection means of claim 7 wherein said third means comprises a hysteresis mechanism, said hysteresis mechanism operating to insure that when said supply voltage remains above the specified voltage level, said second voltage supplied to said second means is larger in magnitude than said reference voltage, and when said supply voltage falls below the specified voltage level, said second voltage supplied to said second means is smaller in magnitude that said reference voltage.

* * * * *